United States Patent [19]

Umemura

[11] Patent Number: 4,816,671

[45] Date of Patent: Mar. 28, 1989

[54] PUSH-BUTTON SWITCH WITH MULTI-STAGE ACTION

[75] Inventor: Heihachiro Umemura, Sakai, Japan

[73] Assignee: Shinkoh Electric Co., Ltd., Osaka, Japan

[21] Appl. No.: 81,693

[22] Filed: Aug. 4, 1987

[30] Foreign Application Priority Data

May 18, 1987 [JP] Japan .................. 62-120649

[51] Int. Cl.⁴ ............................. G01D 5/34
[52] U.S. Cl. ...................... 250/229; 341/31
[58] Field of Search ............ 340/365 P; 250/229, 250/231 R, 231 P, 221

[56] References Cited

U.S. PATENT DOCUMENTS

| | | | |
|---|---|---|---|
| 3,123,724 | 3/1964 | Schrenk et al. | 250/229 |
| 3,465,099 | 9/1969 | Harris | 340/365 P |
| 3,668,407 | 6/1972 | Matzen et al. | 340/365 P |
| 3,946,225 | 3/1976 | Beeck | 340/365 P |
| 4,379,968 | 4/1983 | Ely et al. | 340/365 P |
| 4,429,219 | 1/1984 | Yochum et al. | 250/229 |

Primary Examiner—David C. Nelms
Assistant Examiner—Michael Messinger
Attorney, Agent, or Firm—Wenderoth, Lind & Ponack

[57] ABSTRACT

A push-button switch including a housing, at least one pair of push-buttons movably mounted in the housing, a plurality of light-emitting elements, a plurality of photo-sensors arranged to receive light from the light-emitting elements and light blocking members on the push buttons for selectively blocking light received by the photo-sensors. The buttons are spaced apart in a longitudinal direction and each includes a light blocking member which is movable with the push-button from a non-operating position to a plurality of signal sending positions in a vertical direction perpendicular to the longitudinal direction. The light-blocking members are spaced apart in a lateral direction perpendicular to the longitudinal and vertical directions and overlap in the longitudinal direction. The light-blocking members are shaped to allow light emitted from at least one light-emitting element to be received by the respective photo-sensor element when at least one of the push-buttons is in each of the signal sending positions.

19 Claims, 5 Drawing Sheets

PUSH-BUTTON SWITCH WITH MULTI-STAGE ACTION

BACKGROUND OF THE INVENTION

1. Field of the Invention

This invention relates to a push-button switch which is capable of carrying out multistage operation by one push-button; and performs ON/OFF switching of a circuit without physical contact.

2. Description of the Prior Art

Conventional push-button switches for operating hoists, cranes, etc. are generally of the contact type. Push-button switches of this type emit sparks at each switching operation and this sparking results in wearing of the contacts and shortening of the usable life of switches. Thus, conventional push-button switches must be replaced with new ones frequently and lack reliability of crane operation. Furthermore, it is required to keep the distance between contacts at the allowable extent for safety operation and therefore in the case of multistage push-button switches, they are limited in miniaturization. Since each operation of lengthwise traveling, sideways traveling, winding, winding down, etc. is carried out by a respective switch, one pendant switch case must hold many push-button switches. Therefore, the switch case is large in size the one-handed manipulation of it is difficult.

There is available a system for the multistage operation by a single switch, using a variable resistor. According to this system, maintenance of the required speed, as well as the speed increase or decrease of a motor, can be carried out by only turning a knob. However, the variable resistor involves mechanical wear and is poor in durability. Moreover, it is difficult to do the micro-regulation by a knob with gloved hands. The output from the variable resistor is the analog variation and is liable to be affected by noise, for example, while it is being transmitted by cable.

In view of the above, the present invention has for its object to carry out various operations accurately and easily by giving a plurality of digital signals by the depressing operation of a single push-button of non-contact type.

SUMMARY OF THE INVENTION

The push-button switch according to the present invention comprises push-buttons in pairs provided with a space therebetween, a photo-sensor group and a light-emitting element group provided between the two push-buttons, and shade plates (each of which is fitted to a respective push-button and extends to the opposing push-button side). The photo-sensor group and the light-emitting element group are arranged opposite to each other, with the two shade plates interposed therebetween, and each shade plate has a light-transmitting window hole and a shading piece. The push-button is provided with a multistage action mechanism which engages with a plurality of engaging parts successively when it shifts by being depressed. Under such arrangement, the two shade plates which overlap each other vary a light-transmitting position at each engagement by the multistage action mechanism and select light transmission to a plurality of photo-sensors (light receiving elements), whereby light is projected to the designated photo-sensor for generating ON/OFF signals.

Under the above arrangement, as a plurality of photo-sensors are made selectively ON/OFF, a variety of signals can be taken out by the combination of photo-sensors and therefore the number of signal lines can be less than the number of signals. Moreover, as the push-button moves with many actions and changes over ON/OFF of the photo-sensors at its position of each action, changeover of ON/OFF is done accurately. Since output signals are digital signals of ON/OFF, there is less danger of the signals being affected by noise or other barriers and changeover operation of high accuracy can be carried out.

DETAILED DESCRIPTION OF THE INVENTION

Figure 1:
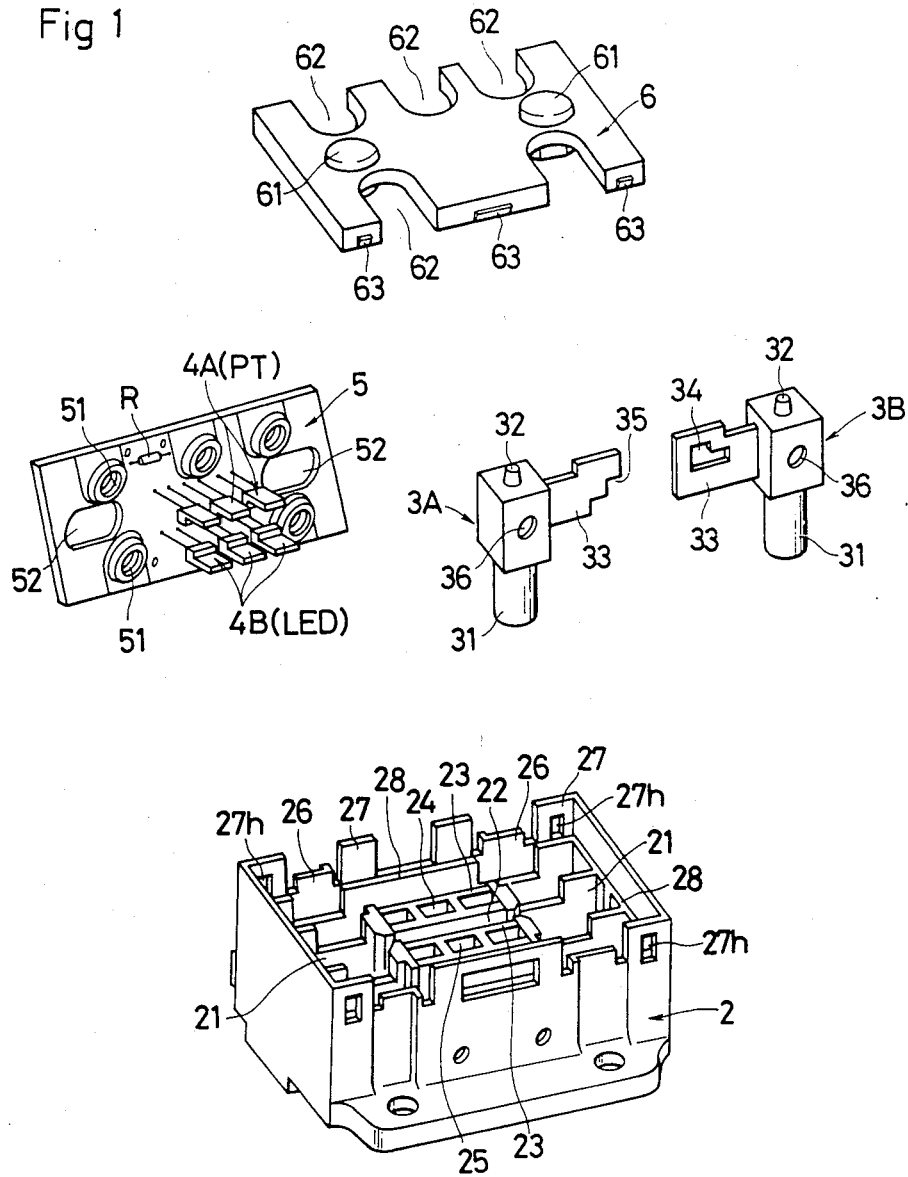
FIG. 1 is an exploded perspective view of the push-button switch according to the present invention as seen from the back side.
Figure 2:
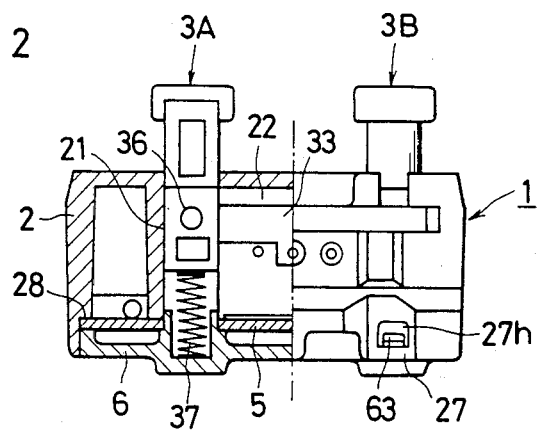
FIG. 2 is a front view of a left half of the push-button switch as it is sectioned.
Figure 3:
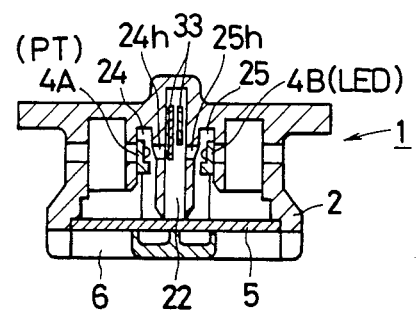
FIG. 3 is a longitudinal side elevation.

A description is made below of the present invention, on the basis of a preferred embodiment.

A push-button switch 1 comprises push-buttons 3A, 3B in pairs contained in a casing 2, a photo-sensor (light-receiving element) group 4A which is disposed between the push-buttons, a light-emitting element group 4B which forms a pair with said group 4A, and shade plates 33, each of which is fitted to the push-button 3A, 3B and extends to the opposing push-button side. The photo-sensor group 4A and the light emitting element group 4B are opposed to each other, with the shade plates 33 therebetween, and are fitted to a printed base plate 5. The casing 2 is made of a material which is light in weight, durable and insulating, for example, synthetic resin. Extending through the back side of the casing 2 are push-button inserting grooves 21, 21 through which two push-buttons are placed with the shade plates opposed to each other. A shade plate inserting groove 22 is formed between the push-button inserting grooves 21, 21 contiguously to the push-button inserting grooves 21, 21. The shade plate inserting groove 22 is opposed to the two push-buttons and when the two push-buttons which are spaced apart in a longitudinal direction are inserted in a vertical direction (perpendicular to the longitudinal direction) in the respective push-button inserting groove 21, two shade plates overlap each other in a transverse direction (perpendicular to the longitudinal and vertical directions). Provided at the central part of the casing 2 are element inserting grooves 24, 25, with the shade plate inserting groove 22 therebetween, in which the light-receiving element PT group 4A (phototransistor, CD cell, photo-diode, etc.) and the light-emitting element LED group 4B which are opposed to each other are inserted respectively. These element inserting grooves 24, 25 which can each comprise three or four grooves, extend in the vertical direction and are arranged in a row along the longitudinal direction of the shade plate inserting groove 22 so that three or four sets of a pair of light-receiving element PT and a light-emitting element LED can be used or such inserting grooves can be a single groove in which the light-emitting element group or the light-receiving element group is inserted collectively. The element inserting grooves 24, 25 are open only at the side facing the bottom surface of the casing 2. Extending from the inner sides of the element inserting grooves 24, 25 are light-transmitting holes 24h, 25h. These holes are made in such a fashion that they are located on the same straight line as the light progressing (transverse) direction so that light of the light-emitting element which is emitted at all times can reach the side of the light-receiving element. Formed integrally at the outer circumference of the bottom side of the casing 2 are a short base plate guide 26 which supports a base plate and a back lid and also a lid guide 27 with a hole 27h which engages with a lid plate. Provided at the inner side of the lid guide 27 is a base plate receiver 28 with a shoulder part so that it is on the same level with the undersurface of circumferential walls 23, 23 forming the element inserting grooves 24, 25.

Since the push-buttons 3A and 3B are of the same construction, a description is made below about one of them. The push-button 3A is so shaped and sized that it is not loose in the push-button inserting groove 21 and slides smoothly in a vertical direction from a first position to a plurality of signal sending positions. Provided at a part of the push-button and protrudingly through a hole made at the top part of the casing 2 is a push piece 31 for depressing the push button. Provided at the opposite side of the push piece 31 is a protrusion 32 for stopping a spring and at the side thereof is a light blocking member comprising a shade plate 33. The shade plate 33 which is provided on the other push-button 3B has a light transmitting window hole 34 such as a notch, a window or the like so that when this push-button is depressed, light of selected light-emitting elements from among emitting element group and the light can reach the corresponding light-receiving element. Provided on the other push-button 3A at the outer end side of the light-transmitting window hole 34 is a depression shading piece 35, such as a protruding piece so that when this push-button is depressed, light between the light-emitting element and the light-receiving element is interrupted. The shade plates 33 of push-buttons 3A, 3B are so arranged that they overlap each other and the light-transmitting window hole 34 of one push-button is located at the position of the depression shading piece 35 of the other push-button when both push-buttons are at a non-operating position (ascending position).

Figure 4:
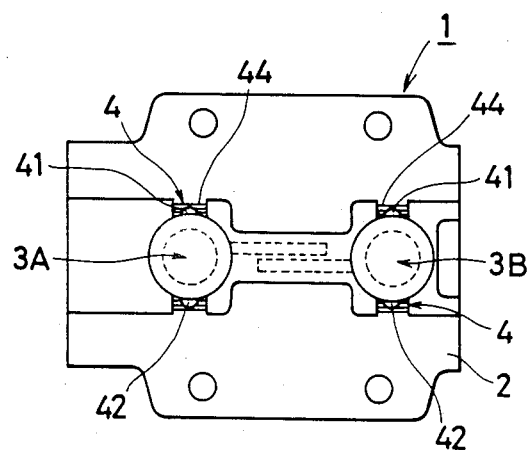
FIG. 4 is a plan view.
Figure 5:
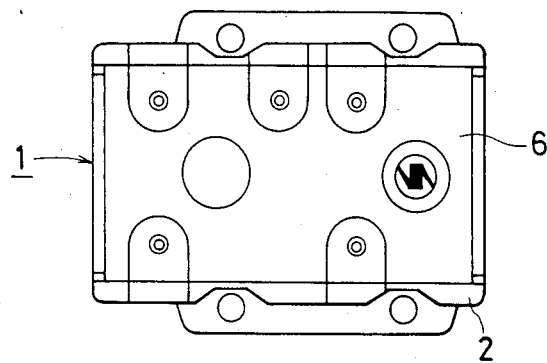
FIG. 5 is a bottom view and also an explanatory drawing of the action mechanism.
Figure 6:
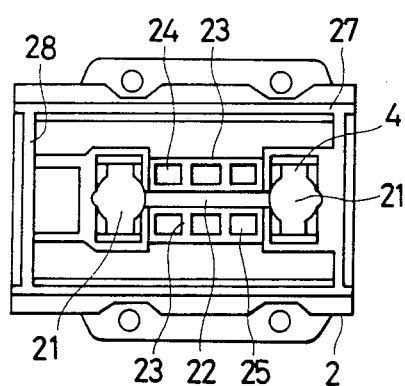
FIG. 6 is a bottom view of the casing.
Figure 16:
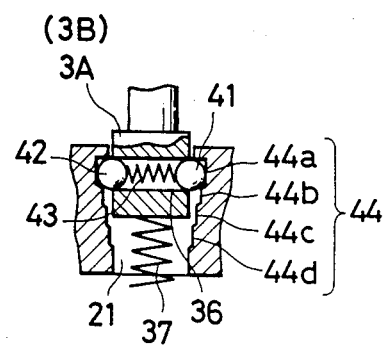
FIG. 16 is a cross section of the action mechanism.

Action mechanisms 4, 4 (FIGS. 4 and 16) are arranged between the push-buttons 3A, 3B and the push-button inserting grooves 21, 21 in which the push-buttons are inserted. The action mechanism is composed of two balls 41, 42 which are inserted in a through hole 36 made in the push-button proper 3A, 3B, a spring 43 which forces the balls outwardly and an engaging part 44 (shoulder parts, notches or the like) formed at the inner surface of the inserting groove 21. The engaging part 44 shown in the drawing has the stop position 44a (the position to which the push-button is pushed up by a main spring 37 while it is not depressed) and engaging projections 44b, 44c, 44d (hereinafter referred to as the first, second and third projections).

A print base plate 5 and a lid plate 6 are fixed to the lower part of the casing 2. This print base plate 5 is of such size that it can be fixed in the base plate guide 26 and the lid guide 27 formed protrudingly at the circumference of the lower bottom surface of the casing 2. Print wirings are made on this print base plate 5. Screw holes 51, 51 ... in which terminals are fitted for power supply to each light emitting element LED and those for taking out electric signals from each light receiving element PT are made in the base plate 5. The light emitting element LED and the light receiving element PT are paired in opposition to each other and three or four sets of this pair are provided. These sets are inserted in the element inserting grooves 24, 25 of the casing 2 and fixed with a register R. Spring inserting holes 52, 52 through which respective springs 37, 37 for reinstating each push-button by biasing the push-button out of the signal sending positions to the non-operating position are made in the base plate 5.

The lid plate 6 is intended for fixing the base plate 5 and for preventing dust from entering element parts and other parts in the casing 2. It is made of insulating material and is formed in such a shape as shown in FIG. 1. The lid plate 6 is provided with spring supporting parts 61, 61 for supporting the springs 37. Notches 62, 62 ... in which terminals are inserted are provided on both sides of the spring supporting parts 61, 61. These notches 62 are made at such a position that when the lid plate is fixed to the casing 2, they are opposed to the upper end of the base plate guide and screw holes 51 for terminal fixing made in the bse plate 5. Provided at outer end surfaces of both sides of the notches 62 are engaging pieces 63 of hook-shape which engage with the engaging holes 27h of the casing 2.

The assembling of each part is described below, with reference to FIG. 1. Two push-buttons 3A, 3B are inserted in push-button inserting grooves 21, 21 in such a fashion that shade plates of the push-buttons overlap each other and push pieces 31, 31 protrude from the top surface of the casing 2. Then, the base plate 5 on which light-emitting group 4A and light-receiving group 4B in pairs are print wired is applied to the back surface of the casing 2. At this time, it is essential that each light-receiving element is inserted accurately in the element inserting groove 24 and each light-emitting element is inserted accurately in the element receiving groove 25.

Next, two springs 37, 37 are inserted from spring passing through holes 52, 52 of the base plate for engagement with spring stop protrusions 32, 32.

In fixing the lid plate 6, if the lid plate 6 is pressed against the back side of the casing 2 in such a fashion that the spring 37 is inserted in the spring supporting part 61, 61, the engaging piece 63 is inserted in the lid guide and at the same time, is engaged with and fixed to the engaging hole 27h formed on the lid guide. Thus, the base plate 5 is also fixed at the same time as the lid plate is engaged.

In order to facilitate fixing of the push-button switch proper 1 to the switch case or the like, the push-button switch proper 1 has a fitting piece having a fitting screw hole.

The push-button switch constructed as mentioned above can be used singly but in the case where it is used as a pendant switch of crane or the like, at least two push-button switches 1, 1 are arranged in a pendant switch case for each action of lengthwise traveling, sideways traveling, stopping, winding, winding down, etc. In any event, each light-emitting element and each light-receiving element are connected to electric lines which give electric signals for controlling each action and supply electric current.

A description is made below of each action of the two-stage operation shown in FIG. 1–FIG. 10.

Figure 9:
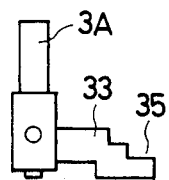
FIG. 9 and FIG. 10 are explanatory drawings of the push-button respectively.
Figure 9:
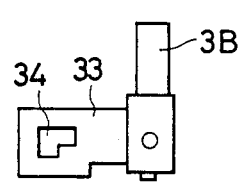

In the case where push-buttons 3A, 3B of modified shape as shown in FIG. 9, if the push-button 3A or 3B is pushed, the push-button is depressed against the force of the spring 37, whereupon light from the designated light-emitting element which is "on" at all times reaches the light-receiving element via a light transmitting window hole of the shade plate which has been depressed and is converted into an electric signal by which the desired action is carried out. At this time, light from the light-emitting element on the other side is shaded by a depression shading piece of the push-button.

Figure 7:
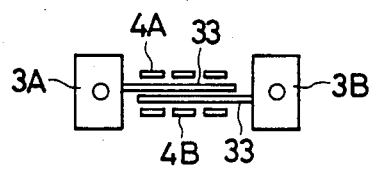
FIG. 7 is an explanatory drawing of the light-emitting and light-receiving elements.
Figure 8:
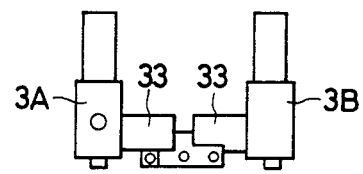
FIG. 8 is an explanatory drawing showing the relation between the two push-buttons and the light-emitting/light receiving elements.

The action of the light-receiving elements A, B, C arranged as shown in FIG. 7 which is done by ON/OFF by the first-stage or the second-stage depressing operation of the push-button 3A on the left side and the push-button 3B on the right side in FIG. 9, is shown in the following table.

|  | Light-receiving element | | | |
|---|---|---|---|---|
|  | A | B | C | Remark |
| Both push-buttons 3A and 3B OFF | OFF | OFF | OFF | Both OFF |
| 3A 3B first-stage OFF ON | ON | OFF | OFF | Right side - slow speed |
| 3B second-stage ON | ON | ON | OFF | Right side - high speed |
| 3B 3A first-stage OFF ON | OFF | OFF | ON | Left side - slow speed |
| 3A second-stage ON | OFF | ON | ON | Left side - high speed |
| Both push-buttons ON | OFF | OFF | OFF | Both OFF by shading |

The central light-receiving element B among three light-receiving elements shown in FIG. 7 is used commonly at the second-stage operation ON.

Figure 10:
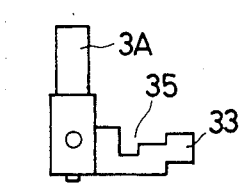
Figure 10:
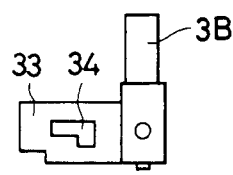

The state of operation in the case where push-buttons 3A and 3B of the shape shown in FIG. 10 is shown in the following table.

|  | Light-receiving element | | | |
|---|---|---|---|---|
|  | A | B | C | Remark |
| Both push-buttons 3A and 3B OFF | OFF | OFF | OFF | Both OFF |
| 3A 3B first-stage OFF ON | OFF | OFF | ON | Right side - slow speed |
| 3B second-stage ON | OFF | ON | ON | Right side - high speed |
| 3B 3A first-stage OFF ON | ON | OFF | OFF | Left side - slow speed |
| 3A second-stage ON | ON | ON | OFF | Left side - high speed |
| Both push-buttons 3A and 3B ON | OFF | OFF | OFF | Both OFF by shading |

Figure 11:
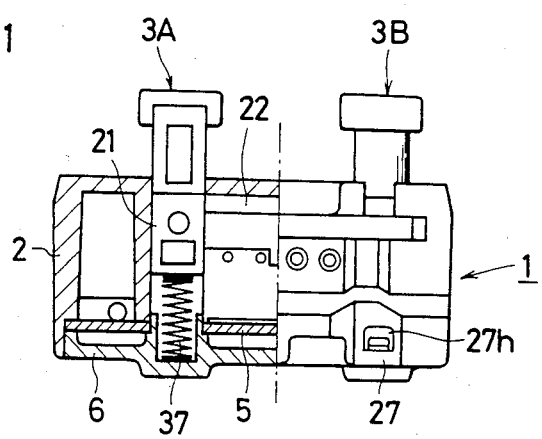
FIG. 11 is a front view of a left half of the three-stage operation switch as it is sectioned.
Figure 12:
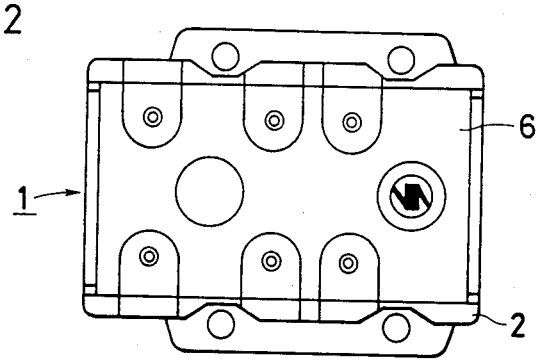
FIG. 12 is a bottom view of the left half shown in FIG. 11.
Figure 13:
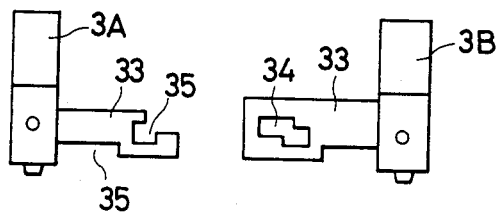
FIG. 13 and FIG. 14 are modified examples of the push-button.
Figure 14:
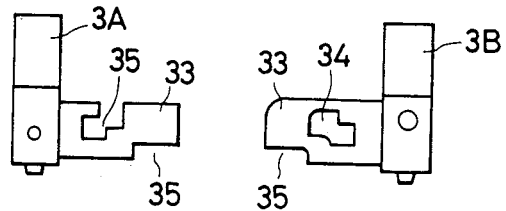
Figure 15:
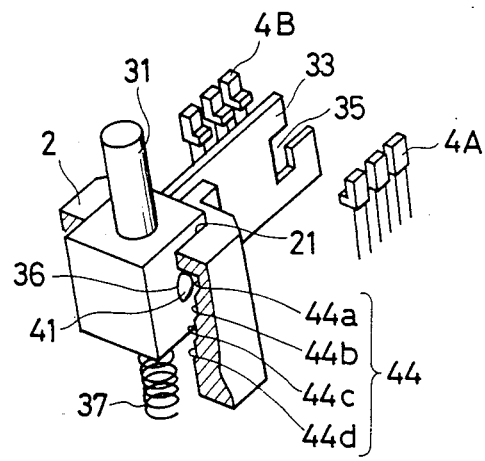
FIG. 15 is an exploded perspective view of the action mechanism of the push-button.

In a three-stage operation switch shown in FIG. 11 and FIG. 12, four pairs of light-emitting elements and light-receiving elements are used and push-buttons 3A, 3B of such shape as shown in FIG. 13 and FIG. 14 are used for them.

In the embodiment, push-buttons 3A, 3B are of different shape but may be of the same shape.

The three-stage operation is carried out in the same way as the two-stage operation. The first stage depression, the second stage depression and the third stage depression are done by means comprising an action mechanism for providing resistance to movement of the push-buttons between each of the plurality of signal sending positions comprising engaging projections 44a–44d of staircase shape formed at the inner surface of the push-button inserting groove by a stepped wall of the housing, two balls 41 and a spring 43 fitted in each push-button for resiliently engaging the balls with the stepped wall. In the embodiment, a pair of light-emitting elements and a light-receiving elements is arranged in a row at opposing push-buttons but may be arranged in parallel.

According to the present invention, as the push-button is moved with a plurality of action and a plurality of light-receiving elements are made ON/OFF selectively at each action position, two-stage operation and switching operation can be sensed accurately and therefore improvement of operability and miniaturization can be realized. Also, as ON/OFF of the circuit is of non-contact system by the light interception, usable life of the push-button can be prolonged. Moreover, a plurality of signals can be generated by a single switch and such signals are digital signals of ON/OFF which are not affected by noise, etc. Also, when the light-emitting element is cut, the push-button will not act even if the push-button is depressed, which ensures safety.

Although the present invention has been described with reference to the foregoing embodiments, various changes and modifications may be made thereto which fall within the scope of the appended claims.

What is claimed is:
1. A push-button switch, comprising:
a housing,
at least one pair of buttons movably mounted in said housing, said buttons being spaced apart in a longitudinal direction and each of said buttons including a light blocking member extending in said longitudinal direction toward the light blocking member of the other one of the push buttons, each said light blocking member being movable along with said push-button to which it is attached from a first position to a plurality of signal sending positions in a vertical direction perpendicular to said longitudinal direction, said light-blocking members being spaced apart in a lateral direction perpendicular to said longitudinal and vertical directions and overlapping in said longitudinal direction;
a plurality of photo-sensor elements mounted in said housing on one side of said light blocking members;

a plurality of light-emitting elements mounted in said housing on the other side of said light blocking members, each of said light-emitting elements being aligned with a respective one of said photo-sensor elements in said lateral direction such that light emitted by said light-emitting elements is received by said photo-sensor elements which output a signal indicating when light is received; and means associated with said light-blocking members for allowing light emitted from at least one of said light-emitting elements to be received by at least one of said photo-sensor elements when at least one of said push-buttons is in each of said signal sending positions.

2. The push-button switch of claim 1, wherein said means comprises cooperating shapes of said light blocking members, the shape of one of said light-blocking members preventing light emitted from at least one of said light-emitting elements and passed in said lateral direction beyond the other one of said light blocking members from being received by at least one of said photo-sensor elements when said light-blocking members are in any of said signal sending positions.

3. The push-button switch of claim 1, further comprising means biasing said buttons in said first position.

4. The push-button switch of claim 1, wherein said means comprises a light-transmitting window in at least one of said light blocking members.

5. The push-button switch of claim 4, wherein one of said light-blocking members includes said light transmitting window therein and the other one of the light-blocking members has an outer periphery which is stepped in said vertical direction.

6. The push-button switch of claim 5, wherein said window is L-shaped such that light is received by one of the photo-sensor elements when said push-button is in at least one of said signal sending positions.

7. The push-button switch of claim 1, wherein said means comprises an outer periphery of at least one of said light blocking members, said outer periphery being stepped in said vertical direction such that a first part of said light blocking member prevents light from being received by only one of said photo-sensor elements when in one of said signal sending positions.

8. The push-button switch of claim 7, wherein a second part of said light blocking member prevents light from being received by two of said photo-sensor elements when in one of said signal sending positions.

9. The push-button switch of claim 8, wherein the other one of said light blocking members prevents light from being received by a third one of said photo-sensor elements when in one of said signal sending positions so that light emitted from said light-emitting elements can be prevented from being received by three of said photo-sensors when said push-buttons are both in one of said signal sending positions.

10. The push-button switch of claim 7, wherein said outer periphery of said light blocking member is stepped in said longitudinal direction and said vertical direction such that one part of said light blocking member prevents light from being received by one of said photo-sensor elements when said push button is in only one of said signal sending positions and a second part of said light-blocking member spaced from said first part in said longitudinal direction prevents light from being received by a second one of said photo-sensor elements when said push button is in each of said plurality of signal sending positions.

11. The push-button switch of claim 1, wherein said means prevents light emitted from all of said light-emitting elements from being received by any of said photo-sensor elements when said push buttons are in said first position.

12. The push-button switch of claim 11, wherein said means allows light emitted from different ones of said light-emitting elements to be received by said photo-sensor elements when said push buttons are in each of said signal sending positions.

13. The push-button switch of claim 1, further comprising means for providing resistance to movement of each of said push buttons between each of said signal sending positions.

14. The push-button switch of claim 13, wherein said resistance means comprises at least one stepped wall in said housing and means supported on each of said push buttons for resiliently engaging the stepped wall.

15. The push-button switch of claim 14, wherein said resiliently engaging means comprises at least one spring biased ball.

16. The push-button switch of claim 14, wherein said at least one stepped wall comprises a pair of opposed stepped walls and said resiliently engaging means comprises a pair of spring biased balls, each of said balls engaging one of said stepped walls.

17. The push-button switch of claim 14, wherein said stepped wall forms one side of a push button groove in said housing in which one of said push buttons is movably supported, means biasing said one push button in said first position being located in said groove and said groove being widest in a plane perpendicular to said vertical direction at a location adjacent said first position.

18. The push-button switch of claim 1, wherein said push buttons are movable independently of each other to any one of said signal sending positions.

19. A push-button switch comprising push-buttons in pairs, with a space therebetween, a photo-sensor group and a light-emitting element group provided between two push-buttons of one of said pairs and shade plates, each of which is fitted to one of the push-buttons and extends towards the other push-button, wherein the photo-sensor group and the light-emitting element group are arranged opposite to each other, with the two shade plates interposed therebetween, each shade plate having a light-transmitting window hole and a shading piece, each of the push-buttons being provided with a multistage action mechanism which engages with a plurality of engaging parts in succession when it is depressed, the two shade plates which overlap each other varying a light-transmitting position at each of the multistage engagements by the multistage action mechanism and selecting a light path to one of a plurality of photo-sensors comprising the photo-sensor group, giving signals of ON/OFF by the designated photo-sensor.

* * * * *